United States Patent
Kim et al.

(10) Patent No.: US 9,001,018 B2
(45) Date of Patent: Apr. 7, 2015

(54) LIQUID CRYSTAL DISPLAY DEVICE FOR REDUCING POWER CONSUMPTION AND METHOD OF DRIVING THE SAME

(75) Inventors: Hak-Su Kim, Daegu (KR); Mi-Kyung Kim, Gyeongbuk (KR)

(73) Assignee: LG Display Co., Ltd., Seoul (KR)

( * ) Notice: Subject to any disclaimer, the term of this patent is extended or adjusted under 35 U.S.C. 154(b) by 640 days.

(21) Appl. No.: 13/185,806

(22) Filed: Jul. 19, 2011

(65) Prior Publication Data

US 2012/0019497 A1 Jan. 26, 2012

(30) Foreign Application Priority Data

Jul. 20, 2010 (KR) .................. 10-2010-0069828

(51) Int. Cl.
 G09G 3/36 (2006.01)
 G11C 19/28 (2006.01)
 G11C 19/00 (2006.01)

(52) U.S. Cl.
 CPC .............. G09G 3/3677 (2013.01); G11C 19/28 (2013.01); G09G 2310/0286 (2013.01); G09G 2330/021 (2013.01)

(58) Field of Classification Search
 CPC .................. G09G 3/3677; G09G 2310/0286; G09G 2330/21; G11C 19/28
 USPC ................... 345/87, 100, 95, 210, 99; 377/69
 See application file for complete search history.

(56) References Cited

U.S. PATENT DOCUMENTS

| | | | |
|---|---|---|---|
| 2002/0089485 A1* | 7/2002 | Youn | 345/99 |
| 2006/0119560 A1 | 6/2006 | Jeon | |
| 2006/0279512 A1* | 12/2006 | Kim et al. | 345/100 |
| 2007/0146272 A1 | 6/2007 | Yoon et al. | |
| 2009/0160836 A1 | 6/2009 | Lee et al. | |
| 2009/0237391 A1* | 9/2009 | Yanagi et al. | 345/213 |
| 2010/0026619 A1 | 2/2010 | Umezaki | |

FOREIGN PATENT DOCUMENTS

| | | |
|---|---|---|
| CN | 1783702 A | 6/2006 |
| CN | 1952739 A | 4/2007 |

OTHER PUBLICATIONS

SIPO: First Notification of Office Action and SIPO Search Report for Chinese Patent Application No. 201110204239.7—Issued on Oct. 25, 2013—Including English Translation.

* cited by examiner

*Primary Examiner* — Chanh Nguyen
*Assistant Examiner* — John Kirkpatrick
(74) *Attorney, Agent, or Firm* — Morgan, Lewis & Bockius LLP

(57) ABSTRACT

A liquid crystal display wherein power consumption of a gate drive circuit is reduced and a method of driving the same are disclosed. The liquid crystal display includes a liquid crystal panel having pixel regions defined by intersection of a plurality of gate lines and a plurality of data lines, a timing controller to output a clock pulse selectively having a first voltage level, second voltage level and third voltage level of different voltage levels and a data control signal, a gate drive unit to drive the gate lines in response to the clock pulse, and a data drive unit to drive the data lines in response to the data control signal.

14 Claims, 8 Drawing Sheets

LIQUID CRYSTAL DISPLAY DEVICE FOR REDUCING POWER CONSUMPTION AND METHOD OF DRIVING THE SAME

This application claims the benefit under 35 U.S.C. §119 (a) of Korean Patent Application No. 10-2010-0069828, filed in the Korean Intellectual Property Office on Jul. 20, 2010, which is incorporated herein by reference as if fully set forth herein for all purposes.

BACKGROUND

1. Field

The following description relates to a liquid crystal display device, wherein power consumption of a gate drive circuit of the liquid crystal display device is reduced, and a method of driving the same.

2. Discussion of the Related Art

In recent years, a gate in panel (GIP) type liquid crystal display device has been developed wherein a gate drive circuit of the liquid crystal display device is provided in a panel to reduce volume and weight of the liquid crystal display, thereby reducing manufacturing costs.

In a GIP type liquid crystal display device, a gate drive circuit is provided in a non-display region of a liquid crystal panel using an amorphous silicon (a-Si) thin film transistor (TFT). The gate drive circuit includes a shift register to sequentially supply scan pulses to a plurality of gate lines. The shift register includes an output buffer unit to receive a clock pulse from a timing controller and to output the scan pulses and an output controller to control an output of the output buffer unit.

SUMMARY

Accordingly, embodiments of the present invention are directed to a liquid crystal display and a method of driving the same that substantially obviate one or more problems due to limitations and disadvantages of the related art.

An object of the present invention is to provide a liquid crystal display, wherein power consumption of a gate drive circuit is reduced, and a method of driving the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a liquid crystal display includes a liquid crystal panel including a plurality of pixel regions defined by intersections of a plurality of gate lines and a plurality of data lines, a timing controller configured to output a data control signal and a plurality of clock pulses, each of the plurality of clock pulses including at least three voltage levels, a gate drive unit configured to drive the gate lines in response to the clock pulses, and a data drive unit configured to drive the data lines in response to the data control signal, wherein: the at least three voltage levels include first, second, and third voltage levels, the first voltage level includes a higher level than the third voltage level, the second voltage level includes a level between the first and third voltage levels, the first and second voltage levels are applied during an enable period, and the third voltage level is applied during a disable period.

The gate high voltage may have a higher voltage level than the gate low voltage, and the gate middle voltage may have a voltage level between the gate high voltage and the gate low voltage.

The clock pulse may have the gate low voltage for a disable period and the gate middle voltage and the gate high voltage for an enable period.

The enable period may be divided into a first period during which the second voltage level is maintained, and a second period during which the first voltage level is maintained.

The gate middle voltage may be greater than or equal to a voltage level corresponding to half the gate high voltage.

The gate drive unit may include a pull-up switching device configured to be turned on or off according to a logic state of a set of nodes and to output the clock pulse supplied from the timing controller as a scan pulse when turned on.

The lengths of the first and second periods may be adjusted according to the drive characteristics of the liquid crystal panel.

The first period may be longer than or equal to the second period.

Adjacent clock pulses may be overlapped to each other. The overlap may be one, two, or three horizontal periods.

In another aspect, a method of driving a liquid crystal display includes outputting a plurality of clock pulses, each including at least three voltage levels, and driving a plurality of gate lines in response to the clock pulses, wherein: the at least three voltage levels include first, second, and third voltage levels, the first voltage level includes a higher level than the third voltage level, the second voltage level includes a level between the first and third voltage levels, the first and second voltage levels are applied during an enable period, and the third voltage level is applied during a disable period.

The gate high voltage may have a higher voltage level than the gate low voltage, and the gate middle voltage may have a voltage level between the gate high voltage and the gate low voltage.

The clock pulse may have the gate low voltage for a disable period and the gate middle voltage and the gate high voltage for an enable period, and the enable period may be divided into a first period for which the gate middle voltage is maintained and a second period for which the gate high voltage is maintained, the first period being longer than or equal to the second period.

The gate middle voltage may be greater than or equal to a voltage level corresponding to half the gate high voltage.

The lengths of the first and second periods may be adjusted according to the drive characteristics of the liquid crystal panel.

Adjacent clock pulses may be overlapped to each other. The overlap may be for one, two, or three horizontal periods.

In the liquid crystal display according to an embodiment of the present invention, a clock pulse selectively having a gate high voltage, a gate middle voltage, and a gate low voltage of different voltage levels is output. Consequently, power consumption of a pull-up TFT of the gate drive unit, which receives the clock pulse, is reduced.

It is to be understood that both the foregoing general description and the following detailed description are example and explanatory and are intended to provide further explanation of embodiments of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

Figure 1:
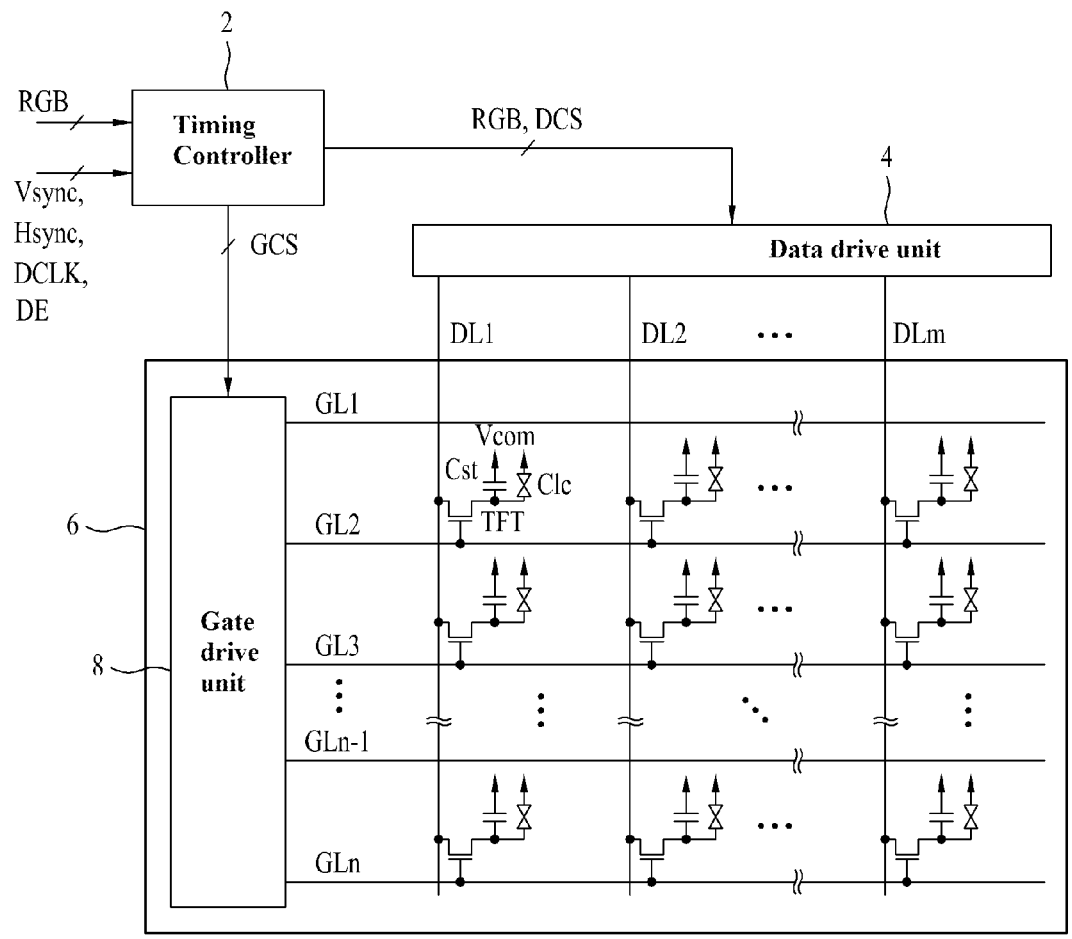
FIG. 1 is a schematic block diagram illustrating a liquid crystal display according to an embodiment of the present invention.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, descriptions of well-known functions and constructions may be omitted for increased clarity and conciseness.

The inventor inventively found that the output buffer unit has a great contribution to the power consumption of gate drive unit. In particular, the power consumption of a gate drive unit depends on the following equation.

$$P=IV=CV^2 f \quad (1)$$

The power consumption of a plurality of thin film transistors (TFTs) constituting the output buffer unit is greatest at the gate drive circuit. Specifically, referring to Equation 1, power consumption P is proportional to current I, voltage V, capacitance C and frequency f. The output buffer unit receives a clock pulse having a highest drive frequency. Also, the size of the TFTs constituting the output buffer unit is greatest at the gate drive circuit, and therefore, capacitance C of a parasitic capacitor generated between a gate electrode and a drain electrode, which receives the clock pulse, of the TFT is highest. Consequently, the drive frequency f of the TFT constituting the output buffer unit is highest, and the capacitance C of the parasitic capacitor is greatest, and power consumption of the gate drive circuit is greatest.

Meanwhile, a display using a gate drive integrated circuit also includes an output buffer unit in the same manner as in the GIP type liquid crystal display. In the gate drive integrated circuit, the output buffer unit is composed of a multi-crystalline silicon TFT. The multi-crystalline silicon TFT has lower capacitance C of a parasitic capacitor than an a-Si TFT.

Consequently, the GIP type liquid crystal display has a higher capacitance C of a parasitic capacitor than a display using a gate drive integrated circuit due to the output buffer unit composed of the a-Si TFT with the result that power consumption increases.

Reference will now be made in detail to embodiments of the present invention, examples of which are illustrated in the accompanying drawings. Wherever possible, the same reference numbers will be used throughout the drawings to refer to the same or like parts.

FIG. 1 is a schematic block diagram illustrating a liquid crystal display device according to an embodiment.

Referring to FIG. 1, the liquid crystal display device may include a liquid crystal panel 6 having pixel regions defined by intersections of a plurality of gate lines GL1 to GLn and a plurality of data lines DL1 to DLm, a timing controller 2 to output a gate control signal GCS and a data control signal DCS, a data drive unit 4 to drive the data lines DL1 to DLm according to the data control signal DCS, and a gate drive unit 8 to drive the gate lines GL1 to GLn according to the gate control signal GCS. The gate drive unit 8 may be provided in the liquid crystal panel 6.

Meanwhile, the gate control signal GCS output from the timing controller 2 may selectively have three voltage levels, by which power consumption of the gate drive unit 8 may be reduced. The gate control signal GCS will be described below in detail.

The liquid crystal panel 6 may include a plurality of gate lines GL1 to GLn and a plurality of data lines DL1 to DLm. The gate lines GL1 to GLn and the data lines DL1 to DLm define pixel regions. Each of the pixel regions may include a thin film transistor (TFT), a liquid crystal capacitor Clc connected to the TFT, and a storage capacitor Cst. The liquid crystal capacitor Clc may include a pixel electrode connected to the TFT and a common electrode to generate an electric field together with the pixel electrode. The TFT may supply an image signal from each of the data lines DLj (j=1 to m) to the pixel electrode in response to a scan pulse supplied from each of the gate lines GLi (i=1 to n). The liquid crystal capacitor Clc may charge a difference voltage between the image signal supplied to the pixel electrode and a common voltage Vcom supplied to the common electrode, and may vary an arrangement of liquid crystal molecules based on the difference voltage to adjust light transmittance, realizing gradation. The storage capacitor Cst may be connected in parallel to the liquid crystal capacitor Clc to maintain the voltage charged in the liquid crystal capacitor Clc until the next image signal is supplied.

Figure 2:
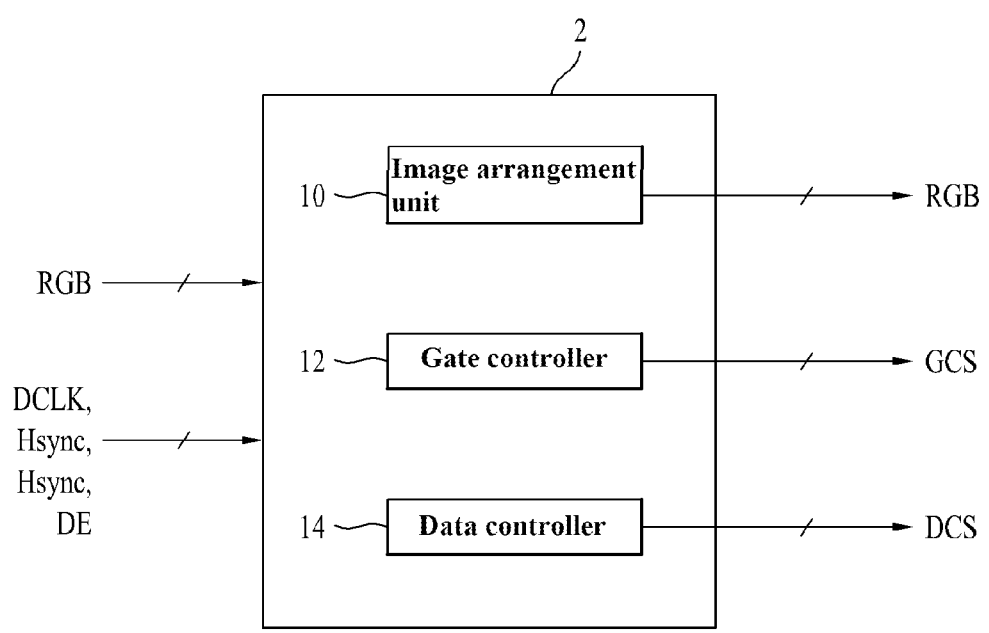
FIG. 2 is a block diagram illustrating a timing controller shown in FIG. 1.

FIG. 2 is a block diagram illustrating the timing controller shown in FIG. 1.

Referring to FIG. 2, the timing controller 2 may include an image arrangement unit 10, a gate controller 12, and a data controller 14.

The image arrangement unit 10 may arrange image RGB (red, green, blue) data input from the outside based on resolution of the liquid crystal panel 6, and may supply the arranged image data to the data drive unit 4 (FIG. 1).

The data controller 14 may generate a data control signal DCS using a synchronization signal input from the outside, and may supply the generated data control signal DCS to the data drive unit 4.

The data control signal DCS may include a source output enable (SOE) to control an output period of the data drive unit 4, a source start pulse (SSP) to indicate start of data sampling, a source shift clock (SSC) to control data sampling timing, and a polarity control signal to control voltage polarity of data.

The gate controller 12 may generate a gate control signal GCS using a synchronization signal input from the outside, i.e., a horizontal synchronization signal (HSync), a vertical synchronization signal (VSync), a dot clock (DCLK), and a data enable signal (DE), and may supply the generated gate control signal GCS to the gate drive unit 8.

The gate control signal GCS may include a clock pulse CLK and a gate Start pulse GSP to indicate drive start of the gate drive unit 8. (See FIG. 4) The clock pulse CLK may include, for example, first to eighth clock pluses CLK1 to CLK8, which may be circulated and output while having different phases. In one embodiment, the clock pulse CLK may include eight clock pluses CLK having different phases. However, the number of clock pulses is not restricted. For example, two or more clock pulses may be used.

The clock pulses CLK1-CLK8 of the gate control signal GCS may be output while each of the clock pulses CLK1-CLK8 may selectively have three voltage levels, by which power consumption of the gate drive unit 8 may be reduced. In one embodiment, each of the clock pulses CLK1-CLK8 may selectively have three different voltage levels. However, the number of different voltage levels is not restricted. For example, three or more voltage levels may be used.

Hereinafter, the clock pulses CLK1-CLK8 output while each of the clock pulses CLK1-CLK8 selectively having three voltage levels will be described.

Figure 3:
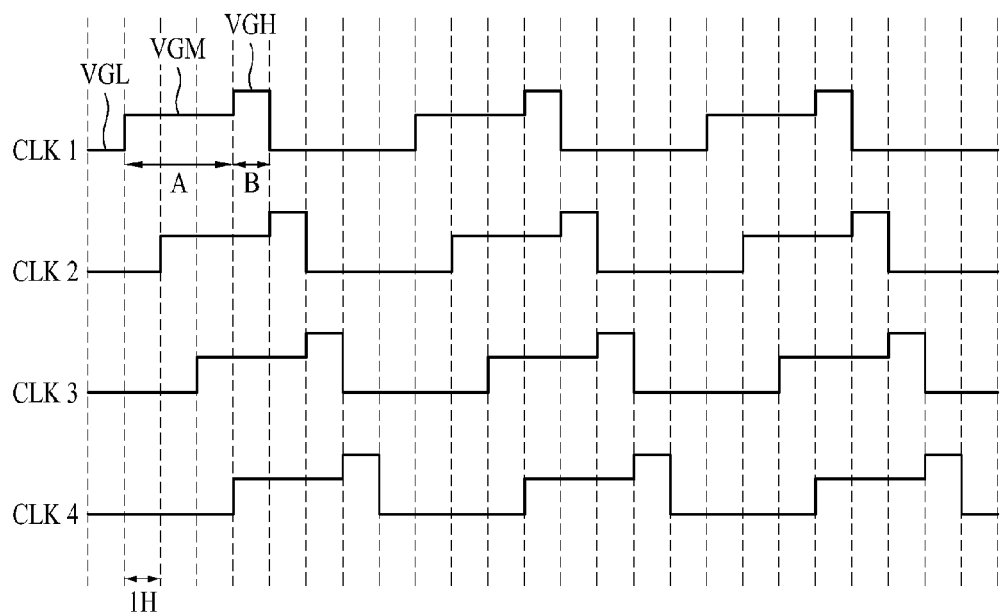
FIG. 3 is an output waveform view of a clock pulse according to an embodiment of the present invention.

FIG. 3 is an output waveform view of clock pulses according to an embodiment.

Referring to FIG. 3, the clock pulses CLK1-CLK4 may be output while each of the clock pulses CLK1-CLK4 may selectively have three voltage levels, i.e., a gate low voltage VGL, a gate middle voltage VGM, and a gate high voltage VGH. The gate high voltage VGH may have a higher voltage level than the gate low voltage VGL. The gate middle voltage VGM may have a voltage level between the gate high voltage VGH and the gate low voltage VGL.

For a disable period, each clock pulse CLK1-CLK4 may have the gate low voltage VGL. For an enable period, each clock pulse CLK1-CLK4 may have the gate middle voltage VGM and the gate high voltage VGH. For example, each clock pulse CLK1-CLK4 may have an enable period corresponding to four horizontal periods (4H). The enable period may be divided into a first period "A" having the gate middle voltage VGM for three horizontal periods (3H), and a second period "B" having the gate high voltage VGH for one horizontal period (1H).

The clock pulse CLK selectively having three voltage levels may be supplied to an output buffer unit P1 (see FIG. 5) of the gate drive unit 8, and power consumption of the output buffer unit P1 may be reduced. The construction of the gate drive unit 8 will be described below before the description of the output buffer unit P1.

It should be noted that FIG. 3 shows that adjacent clock pulses may be overlapped to each other for three horizontal periods (3H). However, the clock pulses are not so restricted.

Figure 4:
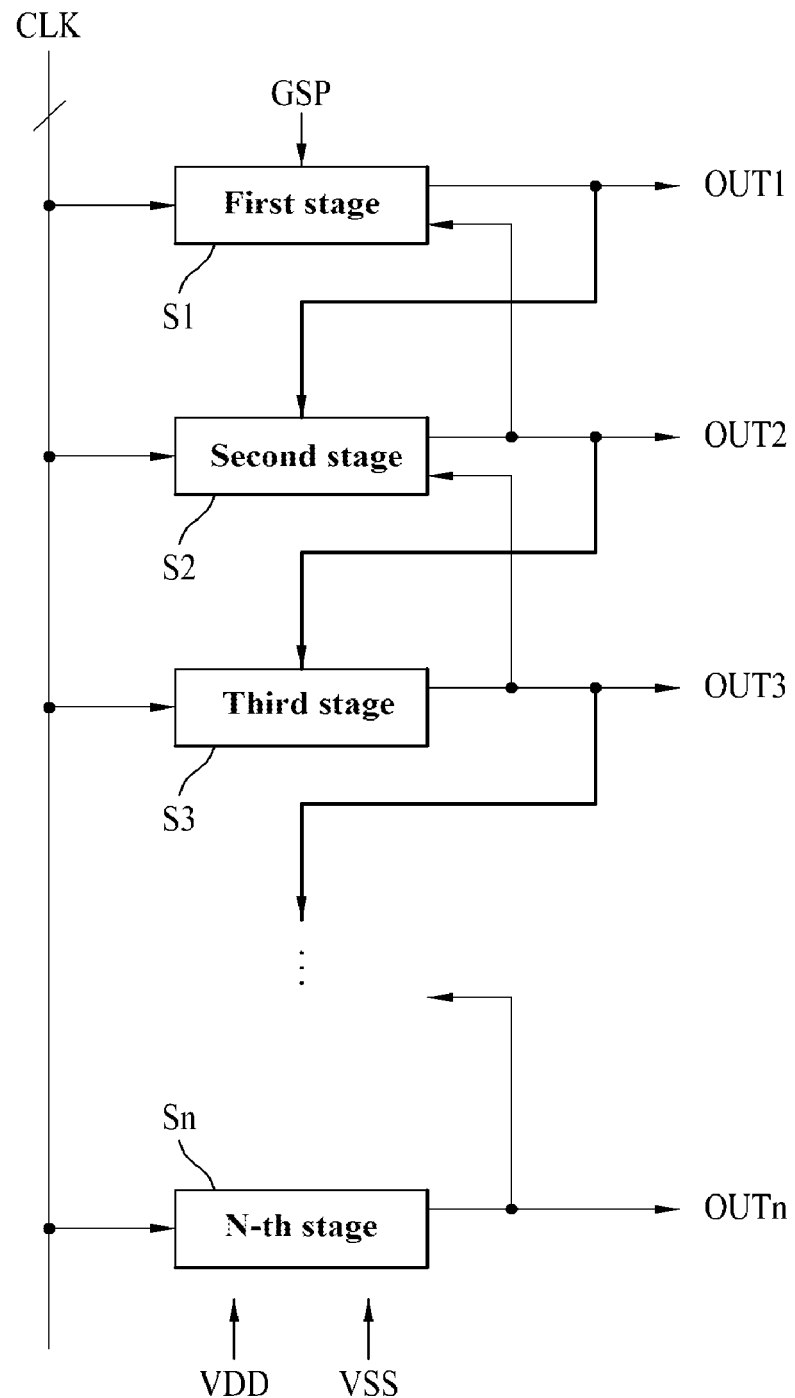
FIG. 4 is a block diagram illustrating a gate drive unit shown in FIG. 1.

FIG. 4 is a block diagram illustrating the gate drive unit shown in FIG. 1.

The gate drive unit 8 shown in FIG. 1 may include a shift register to sequentially supply scan pulses OUT1 to OUTn to the gate lines GL1 to GLn.

The shift register may include first to nth stages S1 to Sn to sequentially output scan pulses OUT1 to OUTn in response to the clock pulses CLK1-CLK8 and a gate start pulse GSP supplied from the timing controller 2. The stages S1 to Sn may output scan pulses OUT1 to OUTn once per frame. The first stage S1 to the n-th stage Sn may output scan pulses OUT1 to OUTn in order.

To this end, a high potential voltage VDD, a low potential voltage VSS, and one of the first to eighth clock pulses CLK1 to CLK8 supplied from the timing controller 2 may be applied to each of the stages S1 to Sn. The high potential voltage VDD and the low potential voltage VSS may be direct-current voltages. The high potential voltage VDD may be higher than the low potential voltage VSS. For example, the high potential voltage VDD may indicate a positive polarity, and the low potential voltage VSS may indicate a negative polarity. On the other hand, the low potential voltage VSS may be a ground voltage.

The first to nth stages S1 to Sn may receive scan pulses from the previous stages and may output scan pulses OUT1 to OUTn in an enable state. Also, the first to nth stages S1 to Sn may receive scan pulses from the next stages and may output scan pulses OUT1 to OUTn in a disable state. However, as there is no stage before the first stage S1, the first stage S1 may receive a gate start pulse GSP from the timing controller 2. Also, the nth stage may output the scan pulse OUTn in a disable state in response to a scan pulse supplied from a dummy stage (not shown).

A process of, for example, the first stage S1 outputting scan pulse OUT1 will now be described.

Figure 5:
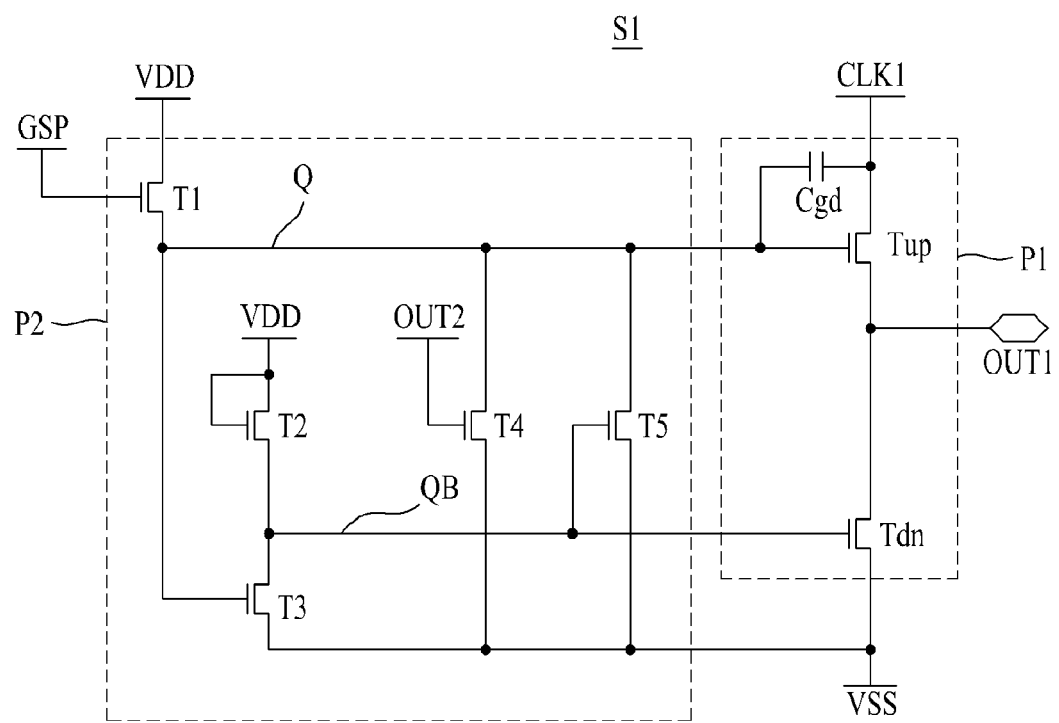
FIG. 5 is a schematic block diagram illustrating a first stage shown in FIG. 4.
Figure 6:
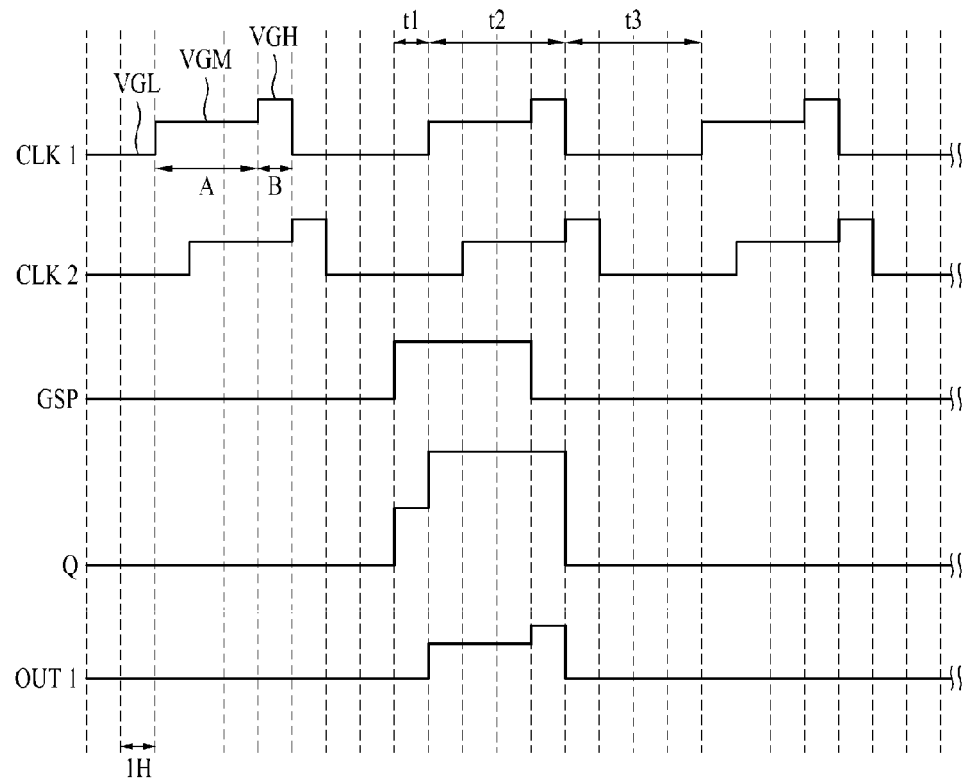
FIG. 6 is an operation waveform view of the first stage shown in FIG. 5.

FIG. 5 is a schematic block diagram illustrating the first stage shown in FIG. 4, and FIG. 6 is an operation waveform view of the first stage shown in FIG. 5.

Referring to FIG. 5, the first stage S1 may include an output controller P2 and an output buffer unit P1. The output controller P2 may include first to fifth TFTs T1 to T5 to control the output buffer unit P1. The output buffer unit P1 may include a pul-up TFT Tup and a pull-down TFT Tdn to output a first scan pulse OUT1 according to the output controller P2.

The first TFT T1 may be turned on or off according to a gate start pulse GSP. When turned on, the first TFT T1 may interconnect a high potential voltage VDD line and a first node Q.

The second TFT T2 may be turned on or off according to the high potential voltage VDD supplied from the high potential voltage VDD line. When turned on, the second TFT T2 may interconnect the high potential voltage VDD line and a second node QB.

The third TFT T3 may be turned on or off according to a logic state of the first node Q. When turned on, the third TFT T3 may interconnect a low potential voltage VSS line and the second node QB.

The fourth TFT T4 may be turned on or off according to a second scan pulse OUT2 supplied from the second stage S2. When turned on, the fourth TFT T4 may interconnect the low potential voltage VSS line and the first node Q.

The fifth TFT T5 may be turned on or off according to a logic state of the second node QB. When turned on, the fifth TFT T5 may interconnect the low potential voltage VSS line and the first node Q.

The pull-up TFT Tup may be turned on or off according to a logic state of the first node Q. When turned on, the pull-up TFT Tup may output a first clock pulse CLK1 as the first scan pulse OUT1.

The pull-down TFT Tdn may be turned on or off according to a logic state of the second node QB. When turned on, the pull-down TFT Tdn may output low potential voltage VSS supplied from the low potential voltage VSS line as the first scan pulse OUT1.

The first stage S1 may be operated as follows.

Referring to FIG. 6, in the first stage S1, a gate start pulse GSP in an enable state may be supplied to a gate electrode of the first TFT T1 for a set period t1. As a result, the first TFT T1 may be turned on, and high potential voltage VDD may be supplied to the first node Q and a gate electrode of the third TFT T3 through the first TFT T1. Consequently, the first node Q may be pre-charged in an enable state. The third TFT T3 may be turned on, and therefore, the second node GB may be disabled.

Subsequently, in the first stage S1, a first clock pulse CLK1 in an enable state may be supplied to a drain electrode of the pull-up TFT Tup for an output period t2 after the set period t1. As a result, voltage of the first node Q may be pre-charged due to a coupling phenomenon caused by the provision of a parasitic capacitor Cgd (see FIG. 5) between a gate electrode, and the drain electrode of the pull-up TFT Tup may be bootstrapped. Consequently, the pull-up TFT Tup may be fully turned on, and the first clock pulse CLK1 in an enable state may be supplied to an output terminal as a first scan pulse OUT1 through the turned-on pull-up TFT Tup. The second node QB may remain disabled.

Subsequently, in the first stage 51, a second scan pulse OUT2 in an enable state may be supplied to a gate electrode of the fourth TFT T4 for a reset period t3 after the output period t2. As a result, the fourth TFT T4 may be turned on, and low potential voltage VSS may be supplied to the first node Q through the fourth TFT T4, and therefore, the pull-up TFT Tup and the third TFT T3 may be turned off. Consequently, the high potential voltage VDD may be supplied to the second node QB through the second TFT T2, and therefore, the pull-down TFT Tdn may be turned on. Also, the low potential voltage VSS may be supplied to the output terminal as the first scan pulse OUT1 through the pull-down TFT Tdn.

Meanwhile, when the TFTs are turned on, signals may be transmitted from source electrodes to drain electrodes or from drain electrodes to source electrodes.

In the respective stages 51 to Sn operated as described above, the size of the pull-up TFT Tup may be greatest and power consumption of the pull-up TFT Tup may be greatest. In one embodiment, a clock pulse CLK may be supplied to the pull-up TFT Tup while selectively having three voltage levels to reduce power consumption of the pull-up TFT Tup.

Referring to Equation 1, power consumption of the pull-up TFT Tup may be proportional to drive frequency f, capacitance C of the parasitic capacitor Cgd, and the square of a voltage V. In one embodiment, as previously described, an enable period of the clock pulse CLK, which may be supplied to the pull-up TFT Tup, may be divided into a first period "A" having gate middle voltage VGM for three horizontal periods (3H), and a second period "B" having gate high voltage VGH for one horizontal period (1H). In one embodiment, therefore, power consumption of the pull-up TFT Tup may be reduced as compared with when a clock pulse having only gate high voltage VGH in an enable state is supplied to the pull-up TFT Tup.

For example, when a clock pulse CLK having only gate high voltage VGH in an enable state is supplied to the pull-up TFT Tup, the square value of the voltage V corresponding to Equation 1 may be equivalent to the square value of voltage difference between the gate high voltage VGH and the gate low voltage VGL, by which the pull-up TFT Tup consumes power. In one embodiment, on the other hand, the square value of voltage V corresponding to Equation 1 may be equivalent to the square value of voltage difference between the gate middle voltage VGM and the gate low voltage VGL in the first period "A", by which the pull-up TFT Tup consumes power, and may be equivalent to the square value of voltage difference between the gate high voltage VGH and the gate low voltage VGL in the second period "B", by which the pull-up TFT Tup consumes power. In one embodiment, therefore, power consumption may be reduced in proportion to the length of the first period "A" for which the clock pulse CLK having the gate middle voltage VGM in an enable state is output.

Meanwhile, the first period "A" of the clock pulse CLK may be a period for which the drive TFT of the liquid crystal panel 6 is pre-charged, and the second period "B" of the clock pulse CLK may be a period for which the drive TFT of the liquid crystal panel 6 is discharged. Consequently, the lengths of the first and second periods "A" and "B" of the clock pulse may be adjusted considering the drive characteristics of the liquid crystal panel 6. For example, the first period "A" of the clock pulse CLK may be set to a period for which the drive TFT of the liquid crystal panel 6 may be sufficiently pre-charged, and the first period "A" may be longer than or equal to the second period "B".

Also, the gate middle voltage VGM corresponding to the first period "A" may be set to a voltage level at which the drive TFT of the liquid crystal panel 6 may be sufficiently pre-charged, and the voltage level of the gate middle voltage VGM may be greater than or equal to a voltage level corresponding to half of the gate high voltage VGH.

Figure 7:
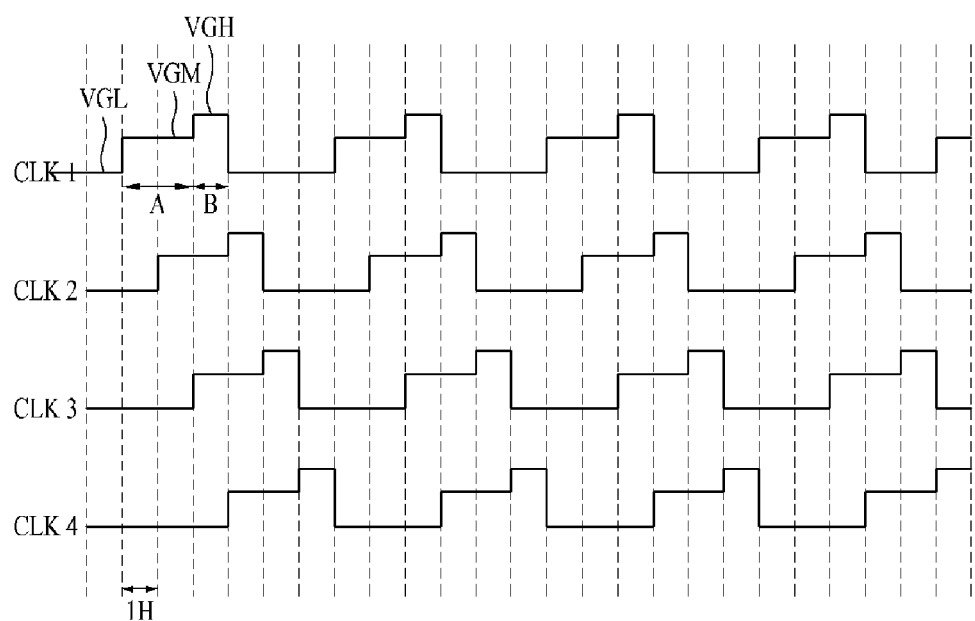
FIG. 7 is an output waveform view of clock pulses according to a second embodiment of the present invention.

FIG. 7 is an output waveform view of clock pulses according to a second embodiment. FIG. 7 shows that adjacent clock pulses may be overlapped to each other for two horizontal periods (2H).

Referring to FIG. 7, the clock pulses CLK1-CLK4 may be output while each of the clock pulses CLK1-CLK4 may selectively have three voltage levels, i.e., the gate low voltage VGL, the gate middle voltage VGM, and the gate high voltage VGH. The gate high voltage VGH may have a higher voltage level than the gate low voltage VGL. The gate middle voltage VGM may have a voltage level between the gate high voltage VGH and the gate low voltage VGL.

For a disable period, each clock pulse CLK1-CLK4 may have the gate low voltage VGL. For an enable period, each clock pulse CLK1-CLK4 may have the gate middle voltage VGM and the gate high voltage VGH. For example, each clock pulse CLK1-CLK4 may have an enable period corresponding to three horizontal periods (3H). The enable period may be divided into a first period "A" having the gate middle voltage VGM for two horizontal periods (2H), and a second period "B" having the gate high voltage VGH for one horizontal period (1H).

Figure 8:
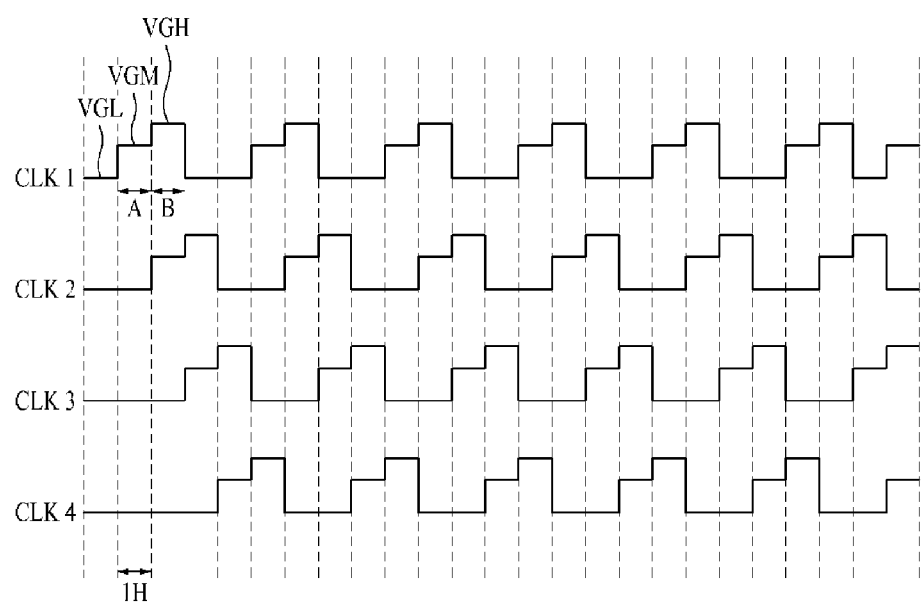
FIG. 8 is an output waveform view of clock pulses according to a third embodiment of the present invention.

FIG. 8 is an output waveform view of clock pulses according to a third embodiment. FIG. 8 shows that adjacent clock pulses may be overlapped to each other for one horizontal period 1H.

Referring to FIG. 8, the clock pulses CLK1-CLK4 may be output while each of the clock pulses CLK1-CLK4 may selectively have three voltage levels, i.e., the gate low voltage VGL, the gate middle voltage VGM, and the gate high voltage VGH. The gate high voltage VGH may have a higher voltage level than the gate low voltage VGL. The gate middle voltage VGM may have a voltage level between the gate high voltage VGH and the gate low voltage VGL.

For a disable period, each clock pulse CLK1-CLK4 may have the gate low voltage VGL. For an enable period, each clock pulse CLK1-CLK4 may have the gate middle voltage VGM and the gate high voltage VGH. For example, each clock pulse CLK1-CLK4 may have an enable period corresponding to two horizontal periods (2H). The enable period may be divided into a first period "A" having the gate middle voltage VGM for one horizontal period (1H), and a second period "B" having the gate high voltage VGH for one horizontal period (1H).

In the liquid crystal display according to one embodiment as described above, the clock pulse CLK may be output while selectively having the gate high voltage, the gate middle voltage, and the gate low voltage of different voltage levels. Consequently, power consumption of the pull-up TFT of the gate drive unit, which may receive the clock pulse CLK, may be reduced.

It will be apparent to those skilled in the art that various modifications and variations can be made in the present invention without departing from the spirit or scope of the inventions. For example, suitable results may be achieved if the described techniques are performed in a different order and/or if components in a described system, architecture, device, or circuit are combined in a different manner and/or replaced or supplemented by other components or their equivalents. Thus, it is intended that the present invention covers the modifications and variations of this invention provided they come within the scope of the appended claims and their equivalents.

What is claimed is:

1. A liquid crystal display, comprising:
    a liquid crystal panel comprising a plurality of pixel regions defined by intersections of a plurality of gate lines and a plurality of data lines;
    a timing controller configured to output a data control signal and a plurality of clock pulses, each of the plurality of clock pulses comprising at least three voltage levels;
    a gate drive unit configured to drive the gate lines in response to the clock pulses; and
    a data drive unit configured to drive the data lines in response to the data control signal,
    wherein:
        the at least three voltage levels comprise first, second, and third voltage levels,
        the first voltage level comprises a higher level than the third voltage level,
        the second voltage level comprises a level between the first and third voltage levels,
        the first and second voltage levels are applied during an enable period, and
        the third voltage level is applied during the entirety of a disable period, the disable period immediately preceding the enable period,
    wherein the enable period is divided into:
    a first period during the entirety of which the second voltage level is maintained, and
    a second period during the entirety of which the first voltage level is maintained,
    wherein the first period is longer than the second period;
    wherein output of the third voltage level is immediately succeeded by output of the second voltage level, and
    wherein output of the second voltage level is immediately succeeded by output of the first voltage level.

2. The liquid crystal display of claim 1, wherein the second voltage level is greater than or equal to a voltage level corresponding to half the first voltage level.

3. The liquid crystal display of claim 1, wherein adjacent clock pulses are overlapped to each other.

4. The liquid crystal display of claim 3, wherein adjacent clock pulses are overlapped to each other for three horizontal periods.

5. The liquid crystal display of claim 3, wherein adjacent clock pulses are overlapped to each other for two horizontal periods.

6. The liquid crystal display of claim 3, wherein adjacent clock pulses are overlapped to each other for one horizontal period.

7. The liquid crystal display of claim 1, wherein the gate drive unit comprises a pull-up switching device configured to:
    be turned on or off according to a logic state of a set of nodes; and
    output the clock pulse supplied from the timing controller as a scan pulse in response to the pull-up switching device being turned on.

8. A method of driving a liquid crystal display, the method comprising:
    outputting a plurality of clock pulses, each comprising at least three voltage levels; and
    driving a plurality of gate lines in response to the clock pulses,
    wherein:
        the at least three voltage levels comprise first, second, and third voltage levels,
        the first voltage level comprises a higher level than the third voltage level,
        the second voltage level comprises a level between the first and third voltage levels,
        the first and second voltage levels are applied during an enable period, and
        the third voltage level is applied during the entirety of a disable period, the disable period immediately preceding the enable period, and
    wherein the enable period is divided into:
        a first period during the entirety of which the second voltage level is maintained, and
        a second period during the entirety of which the first voltage level is maintained,
    wherein the first period is longer than the second period,
    wherein output of the third voltage level is immediately succeeded by output of the second voltage level, and
    wherein output of the second voltage level is immediately succeeded by output of the first voltage level.

9. The method of claim 8, wherein the second voltage level is greater than or equal to a voltage level corresponding to half of the first voltage level.

10. The method of claim 8, wherein adjacent clock pulses are overlapped to each other.

11. The method of claim 10, wherein adjacent clock pulses are overlapped to each other for three horizontal periods.

12. The method of claim 10, wherein adjacent clock pulses are overlapped to each other for two horizontal periods.

13. The method of claim 10, wherein adjacent clock pulses are overlapped to each other for one horizontal period.

14. The method of claim 8, wherein a pull-up switching device:
    turns on or off according to a logic state of a set of nodes; and
    outputs the clock pulse as a scan pulse in response to the pull-up switching device being turned on.

* * * * *